(12) United States Patent
Sano (10) Patent No.: US 7,214,960 B2
(45) Date of Patent: May 8, 2007

(54) ELECTRO-OPTICAL DEVICE AND ELECTRONIC APPARATUS

(75) Inventor: Junichi Sano, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/333,383

(22) Filed: Jan. 18, 2006

(65) Prior Publication Data

US 2006/0192495 A1 Aug. 31, 2006

(30) Foreign Application Priority Data

Feb. 25, 2005 (JP) ............................. 2005-051756

(51) Int. Cl.
*H01L 35/24* (2006.01)
*H01L 51/00* (2006.01)
*H01L 33/00* (2006.01)
*H01L 31/0232* (2006.01)
*H01L 31/00* (2006.01)

(52) U.S. Cl. .................... 257/40; 257/432; 257/443; 257/88; 257/89

(58) Field of Classification Search ................ 257/40, 257/428–443, 79–103
See application file for complete search history.

(56) References Cited

U.S. PATENT DOCUMENTS 6,303,943 B1 * 10/2001 Yu et al. .................... 257/431
2006/0278945 A1 * 12/2006 Sakurai ..................... 257/433

FOREIGN PATENT DOCUMENTS

JP   A-2000-089691   3/2000
JP   A-2004-4397     1/2004

* cited by examiner

*Primary Examiner*—Cuong Nguyen
(74) *Attorney, Agent, or Firm*—Oliff & Berridge, PLC (57) ABSTRACT

An electro-optical device includes a plurality of pixels arranged on a substrate. Each of the pixels includes a plurality of EL light-emitting elements that are disposed on the substrate and are connected in series. Each of the EL light-emitting elements includes a first electrode, a luminescent layer, and a second electrode that are disposed in a thickness direction of the substrate, and each of the EL light-emitting elements has a characteristic of emitting light in response both to a forward applied voltage and to a reverse applied voltage. The first electrodes or the second electrodes of neighboring EL light-emitting elements of the plurality of EL light-emitting elements are coupled to each other, so that the plurality of EL light-emitting elements are connected in series.

5 Claims, 9 Drawing Sheets

ELECTRO-OPTICAL DEVICE AND ELECTRONIC APPARATUS

BACKGROUND OF THE INVENTION

1. Technical Field

The present invention relates to improvements on electro-optical devices such as electro-luminescence (EL) displays.

2. Related Art

EL displays employ a current-driven luminescent body (organic EL or inorganic EL). Large-screen displays including the current-driven luminescent bodies require a significantly large amount of drive currents since the amount of drive currents is proportional to the area of the display unit.

Therefore, for example, an invention disclosed in JP-A-2000-89691 has made a proposal to construct each pixel with a plurality of organic EL elements that are connected in series and to thereby reduce the amount of a drive current flowing through the pixel, so as to reduce power-loss at the organic EL elements and drive transistors.

However, typically the organic EL display element has a multi-layered structure including an anode layer, a luminescent layer and a cathode layer, and has a diode characteristic of emitting light in response only to a forward bias current. When connecting in series plural organic EL display elements arranged in a matrix on a substrate, it is needed to couple the anode of an organic EL element with the cathode of a neighboring organic EL element. However, the anode and the cathode of the neighboring organic EL elements are disposed at different layer levels over the substrate. Accordingly, there arises a need to provide a structure for coupling the anode and the cathode of the neighboring organic EL elements. The existence of this coupling structure in the pixel region including organic EL display elements decreases the luminescent area per one pixel, which leads to lowering of the so-called aperture ratio, which is the ratio of the luminescent area to the pixel area.

SUMMARY

An advantage of some aspects of the invention is to reduce the amount of drive currents in an electro-optical device that employs current-driven light-emitting elements for its display unit, and to provide an electro-optical device that allows improvement of its pixel aperture ratio.

An electro-optical device according to an aspect of the invention includes a plurality of pixels arranged on a substrate. Each of the pixels includes a plurality of EL light-emitting elements that are disposed on the substrate and are connected in series. Each of the EL light-emitting elements includes a first electrode, a luminescent layer, and a second electrode that are stacked in a thickness direction of the substrate, and each of the EL light-emitting elements has a characteristic of emitting light in response both to a forward applied voltage and to a reverse applied voltage. The first electrodes or the second electrodes of neighboring EL light-emitting elements of the plurality of EL light-emitting elements are coupled to each other, so that the plurality of EL light-emitting elements are connected in series.

According to such a structure, series connecting of the EL light-emitting elements can be achieved by coupling the electrodes at the same layer level. The need is eliminated to, in order to connect a plurality of EL light-emitting elements in series, couple a first electrode of one EL light-emitting element to a second electrode, at a different layer level, of a neighboring EL light-emitting element, or couple a second electrode of one EL light-emitting element to a first electrode, at a different layer level, of a neighboring EL light-emitting element. Thus, a structure for coupling electrodes at the different layer levels does not need to be provided in a pixel region. Therefore, an area in the pixel region used for a luminescent body can correspondingly be increased, which enhances the aperture ratio of the pixels. In addition, the area (pattern) of electrodes and so on in EL light-emitting elements included in the pixel can be enlarged relatively. Therefore, mask pattern alignment and so on in the fabrication process are facilitated, which improves the fabrication throughput and yield.

The term electro-optical device refers to typical devices including electro-optical elements that emit light due to electric action. Examples of the electro-optical elements include EL light-emitting elements and electron emission light-emitting elements, which emit light by impinging to a light-emitting plate, electrons generated due to application of an electric field.

The EL light-emitting elements encompass organic EL light-emitting elements and inorganic EL light-emitting elements. The organic EL light-emitting elements encompass high-molecular EL elements and low-molecular EL elements.

Preferably, the electro-optical device further includes a plurality of common electrode interconnects disposed along a row direction or a column direction of the plurality of arranged pixels, and the common electrode interconnect serves as the first electrode or the second electrode of the EL light-emitting element closest to an end of the pixel, of the plurality of serially connected EL light-emitting elements included in the pixel. Thus, interconnect spaces are saved and therefore the aperture ratio can be enhanced.

Preferably, the luminescent layer is formed of a multi-layered structure of a buffer layer, a luminescent body film, and a buffer layer. This structure can achieve a nonpolar EL light-emitting element that emits light in response both to a forward applied voltage and to a reverse applied voltage.

Preferably, the buffer layer includes polyethylenedioxythiophene (PEDOT). As the buffer layer, polyethylenedioxythiophene (PEDOT) can be used for example. The luminescent body film can be composed of a publicly known luminescent material that emits fluorescence or phosphorescence corresponding to red (R), green (G) and blue (B). When the buffer layers are formed on the both sides of the luminescent body layer and these layers are interposed between the first and second electrodes, an organic EL element is obtained that emits light in response both to a forward bias voltage and to a reverse bias voltage.

An electronic apparatus according to another aspect of the invention includes as a display unit the above-described electro-optical device. Such an electro-optical device is preferable as a display of electronic apparatuses. The term electronic apparatus refers to typical apparatuses that are formed of a combination of plural elements and circuits and have certain functions. The electronic apparatus includes an electro-optical device and a memory for example, and may include one or more circuit boards. There is no particular limitation on the configuration of the electronic apparatus. Examples of the electronic apparatuses include an IC card, cellular phone, video camera, personal computer, head-mounted display, rear- or front-type projector, facsimile device with a displaying function, finder of a digital camera, portable TV, DSP device, PDA, electronic notebook, electric sign board, and advertisement display.

BRIEF DESCRIPTION OF THE DRAWINGS

The invention will be described with reference to the accompanying drawings, wherein like numbers refer to like elements.

DESCRIPTION OF EXEMPLARY EMBODIMENTS

First Embodiment

A first embodiment of the invention will be described below with reference to FIGS. 1 to 5. The same parts in the drawings are given the same numerals.

Figure 1:
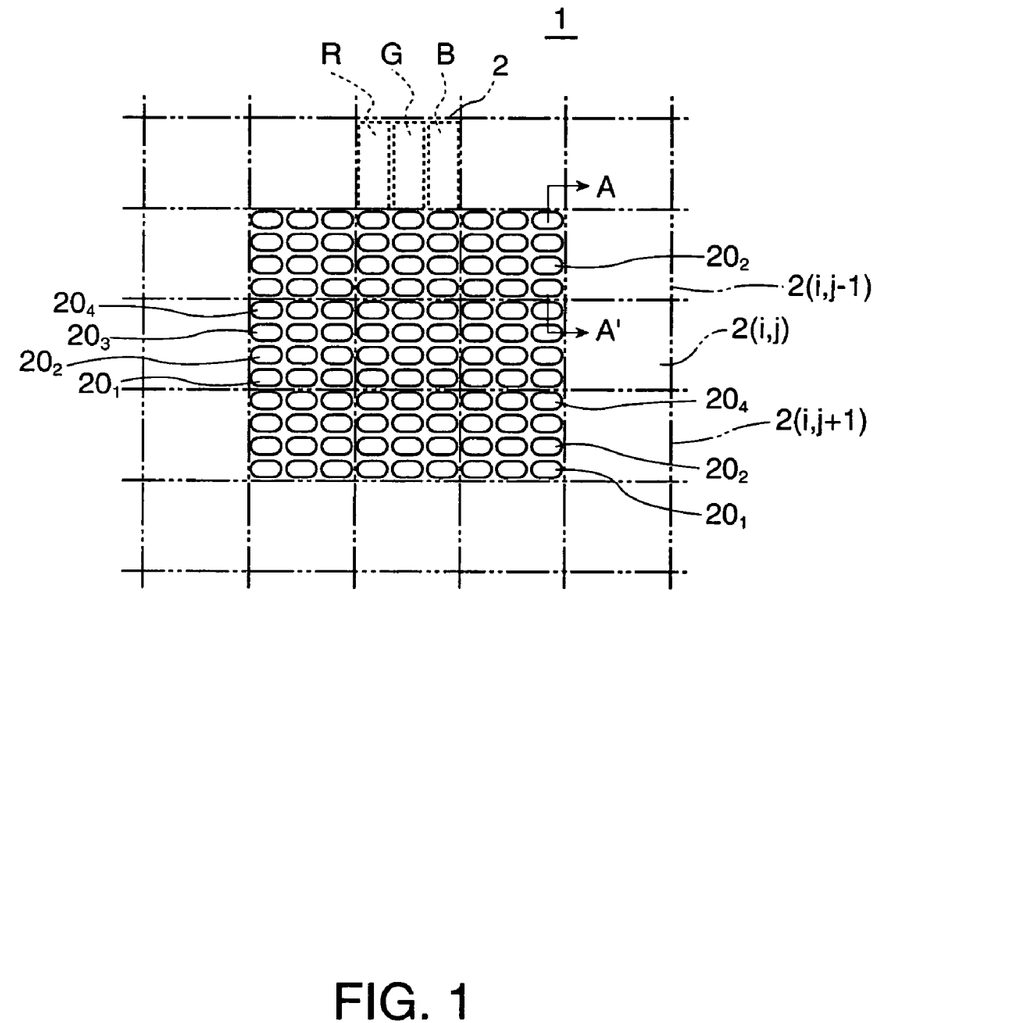
FIG. 1 is an explanatory diagram illustrating the pixel arrangement and light-emitting elements included in each pixel, in an organic EL display according to one embodiment of the invention.

FIG. 1 is an explanatory diagram illustrating the pixel arrangement and the arrangement of light-emitting elements included in each pixel, in an organic EL display that is an electro-optical device to which one embodiment of the invention is applied. Referring to FIG. 1, a plurality of pixels 2 are arranged in a matrix in the display region of an organic EL display 1. Each pixel is formed of three color pixels: red (R), green (G) and blue (B). In this embodiment, each color pixel includes four (even number) light-emitting elements 20 that are connected in series. That is, one pixel 2 includes twelve light-emitting elements 20. Note that illustration of a sealing member (or cap), a row decoder, a column decoder and so on is omitted.

Figure 2A:
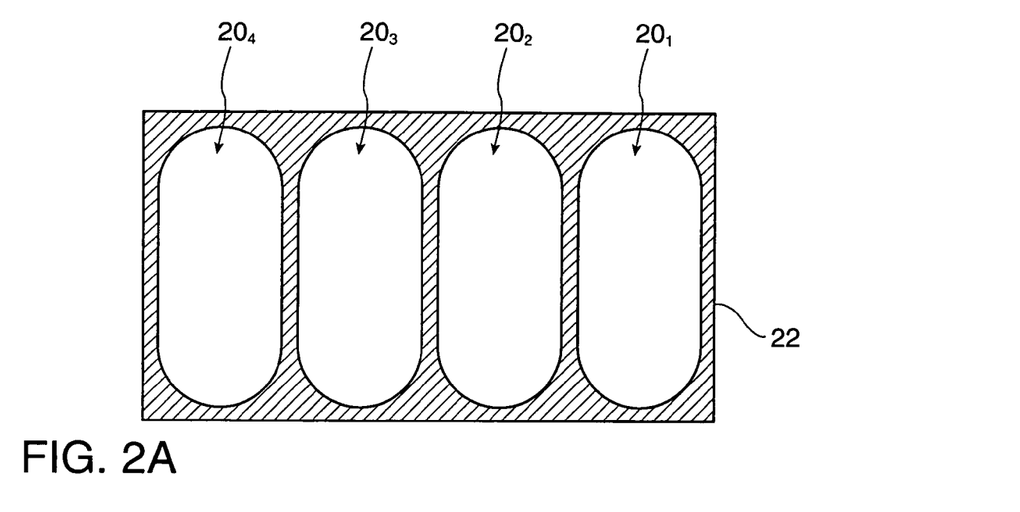
FIG. 2A is an explanatory diagram illustrating the pattern of a bank layer 22 in the organic EL display according to the embodiment.
Figure 2B:
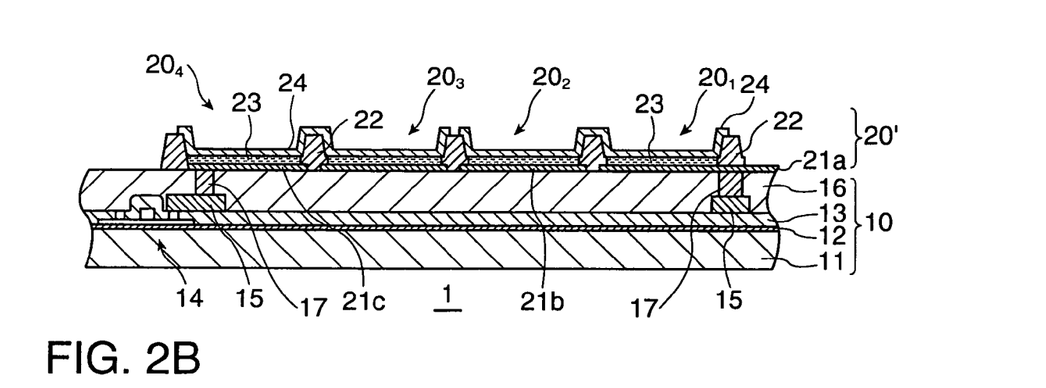
FIG. 2B is a sectional view of the organic EL display according to the embodiment.

FIGS. 2A and 2B are explanatory diagrams illustrating in a magnified form the light-emitting elements 20 (color pixels) connected in series along the line A–A' of FIG. 1. FIG. 2A is a plan view illustrating a partition wall (bank) layer that defines the light-emitting region of each light-emitting element. FIG. 2B is a sectional view for explaining the coupling structure of the plural (four) light-emitting elements 20 connected in series.

Referring to FIG. 2B, the organic EL display 1 includes a semiconductor circuit board 10 and an organic EL display layer 20' that has the plural organic EL elements 20 formed over the semiconductor circuit board 10. The semiconductor circuit board 10 includes a base substrate 11, a protective film 12, an interlayer insulating film 13, a semiconductor circuit 14, interconnects 15, a planarizing film 16, a contact 17 and so on.

The base substrate 11 is a transparent substrate formed of a glass substrate or a flexible resin substrate. This embodiment employs a bottom-emission structure for emitting light downward through the substrate 11 in the drawing, and therefore a transparent substrate is used as the substrate 11. When a top-emission structure for emitting light upward is adopted, the substrate 11 does not need to have transparency. The protective film 12 prevents entrance of impurities from the base substrate 11 to the semiconductor layer (the semiconductor circuit 14). The interlayer insulating film 13 is formed of a silicon oxide layer or the like, and provides insulation between the semiconductor circuit formed of a thin film transistor (TFT) or the like and the interconnect. The interconnect 15 serves as a current channel to the light-emitting element 20. The planarizing film 16 offers a flat surface of the semiconductor circuit board 10, to thereby facilitate the fabrication of the organic EL display layer 20'.

The organic EL display layer 20' includes first electrodes 21 (21a to 21c) formed on the semiconductor circuit board 10, and the bank layer 22 serving as a partition for defining the region of each light-emitting element. The organic EL display layer 20' also includes luminescent layers 23 formed on the first electrodes 21 at the bottoms of recesses formed by the bank layers 22, and second electrode layers 24 formed on the luminescent layers 23. Since this embodiment adopts bottom-emission light-emitting elements as described above, a transparent electrode is used as the first electrodes. As the material of the transparent electrode, ITO (tin-doped indium oxide film) is used. As the second electrode 24, a metal electrode made of gold, aluminum or the like is used.

Figure 3:
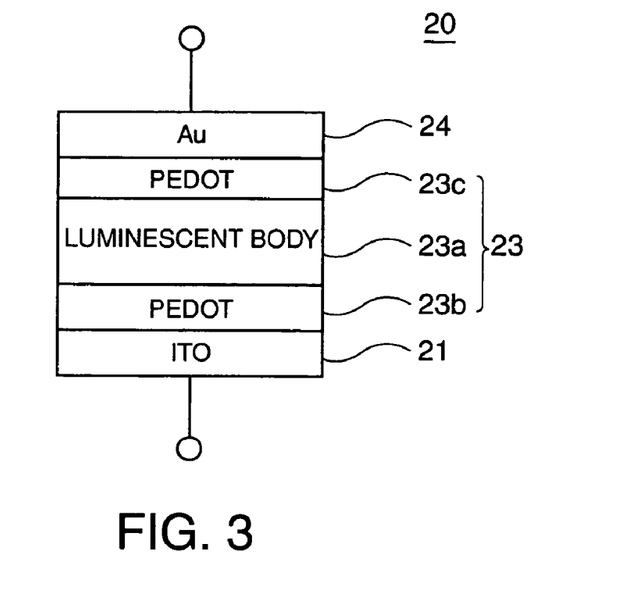
FIG. 3 is an explanatory diagram illustrating an example of a nonpolar organic EL light-emitting element used in the embodiment.

As the luminescent layer 23, a layer configuration is used that emits light in response to application thereto of either of two voltages: a forward bias voltage and a reverse bias voltage. Therefore, as shown in FIG. 3, the organic EL light-emitting element 20 in this embodiment has the luminescent layer 23 that includes a luminescent body 23a and buffer layers 23b and 23c between which the luminescent body 23a is interposed.

Specifically, the organic EL light-emitting element 20 is formed of the ITO layer 21, which is the first electrode, and the buffer layer 23b having a film thickness of 76 nm and including polyethylenedioxythiophene (PEDOT) for example. The organic EL light-emitting element 20 also includes the luminescent body 23a, the buffer layer 23c having a thickness of 260 nm and including PEDOT for example, and the Au layer 24, which is the second electrode. A publicly known material can be used for the luminescent body 23a.

The present assignee has found the knowledge that such an EL light-emitting element including buffer layers on the both sides of a luminescent body emits light in response both to forward bias and to reverse bias, and therefore has found the knowledge that an EL light-emitting element that emits light even when an AC power supply is used therefor can be achieved. The assignee has filed for a patent on the knowledge as another application different from the present application. Note that the reason why such a phenomenon arises is under study. Therefore, the term buffer layer is used expediently, and refers to a layer that is disposed between the luminescent body 23a and the electrode 21, and between the luminescent body 23a and the electrode 24, and has a function of allowing an EL light-emitting material to emit light in response both to a forward bias voltage and to a reverse bias voltage, or in response both to a forward drive current and to a reverse drive current.

By using such so-called nonpolar EL light-emitting elements that operate in response both to a forward bias voltage or current and to a reverse bias voltage or current, the plural EL light-emitting elements 20 can be connected in series in such a manner that the first electrodes 21 or the second electrodes 24 of the neighboring EL light-emitting elements 20 are coupled to each other as shown in FIG. 2B. The first electrodes 21 are at the same layer level in the thickness direction of the substrate and the second electrodes 24 are also at the same level, which makes it easy to couple the electrodes. Specifically, when coupling the first electrodes 21, they can be coupled under the bank layer 22. When coupling the second electrodes 24, they can be coupled over the bank layer 22. These coupling ways provide an advantage of avoiding a decrease of the area of the light-emitting region of EL light-emitting elements due to the coupling of light-emitting elements.

Figure 4:
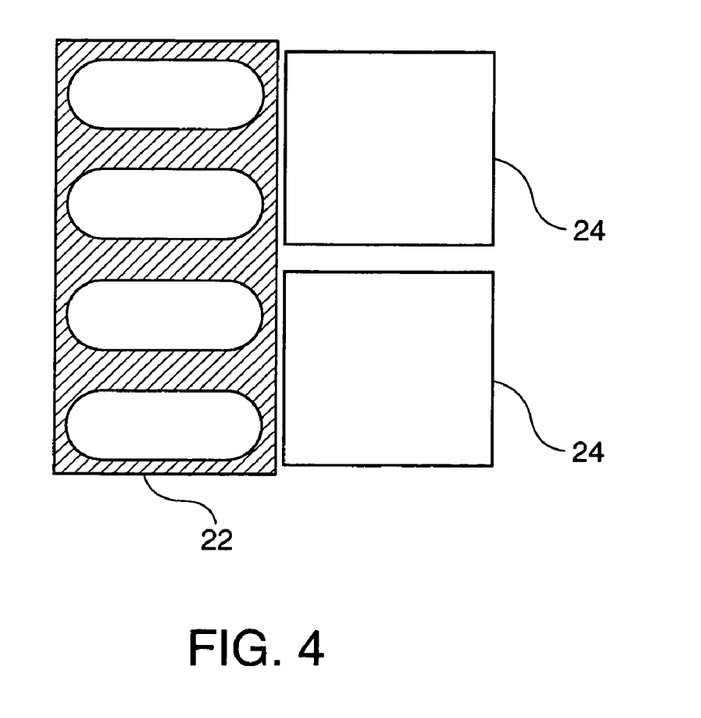
FIG. 4 is an explanatory diagram illustrating with a comparison the pattern of the bank layer 22 and the pattern of second electrodes (upper electrodes) 24 of the embodiment.

FIG. 4 illustrates the patterns of the bank layer 22 and the second electrodes (upper electrodes) 24 shown in FIG. 2. Since each pixel is formed of a plurality of serially connected light-emitting elements, the pattern of the light-emitting elements is small. The electrode pattern however can be enlarged since the second electrodes 24 can be formed in common to two or more EL light-emitting elements. Therefore, alignment among the second electrode layers 24, the bank layer 22 and other layers is facilitated.

Figure 5:
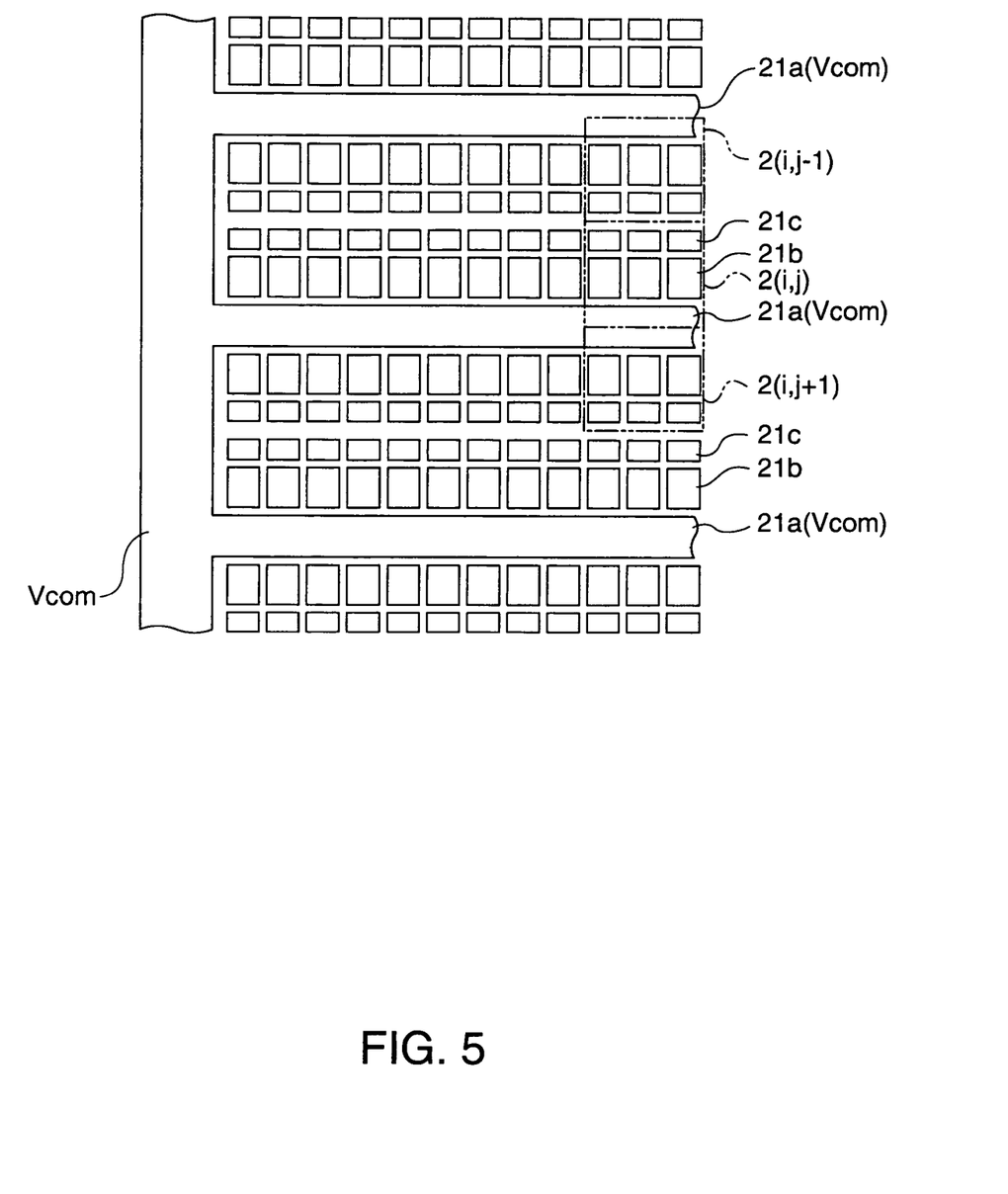
FIG. 5 is an explanatory diagram illustrating the electrode pattern of first electrodes (lower electrodes) of the embodiment.

FIG. 5 illustrates an example of the arrangement pattern of the lower electrodes 21 (21a to 21c) of the organic EL display 1. When each color pixel in the pixel 2(i, j) is formed of four EL light-emitting elements $20_1$–$20_4$ as described above, the lower electrode 21a is shared by the EL light-emitting element $20_1$ of the pixel 2(i, j) and the light-emitting element $20_4$ of the neighboring pixel 2(i, j+1). Furthermore, a common potential Vcom (e.g. a circuit supply voltage Vcc or a ground potential GND) is supplied to the lower electrode 21a. Each lower electrode 21b for the EL light-emitting elements $20_2$ and $20_3$ is shared by the both EL light-emitting elements $20_2$ and $20_3$. The lower electrode 21c for the EL light-emitting element $20_4$ is used as an electrode for a single EL light-emitting element. The lower electrode 21c is coupled to the TFT transistor circuit 14 and thus the driving thereof is controlled.

As shown in FIG. 5, each electrode 21a is shared by pixels of two rows (or two columns), which can reduce the number of circuit interconnects. In step with this, the area of the coupling interconnect pattern is decreased, and thus the area of light-emitting region of EL light-emitting elements can correspondingly be increased. The aperture ratio is also improved.

Comparative Example

Figure 6A:
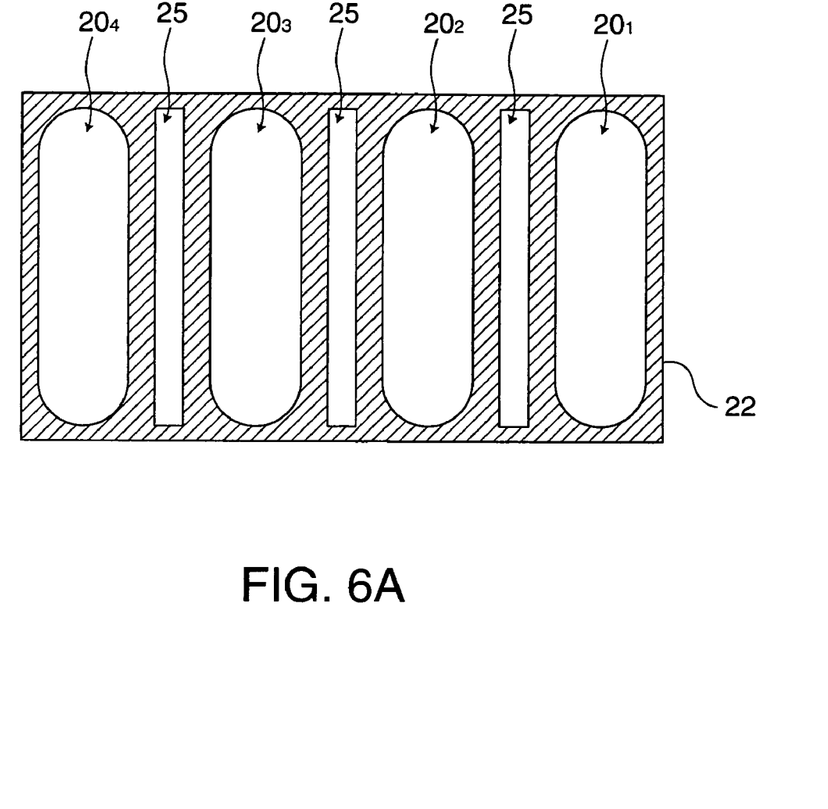
FIG. 6A is an explanatory diagram illustrating the pattern of the bank layer 22 in an organic EL display as a comparative example.
Figure 6B:
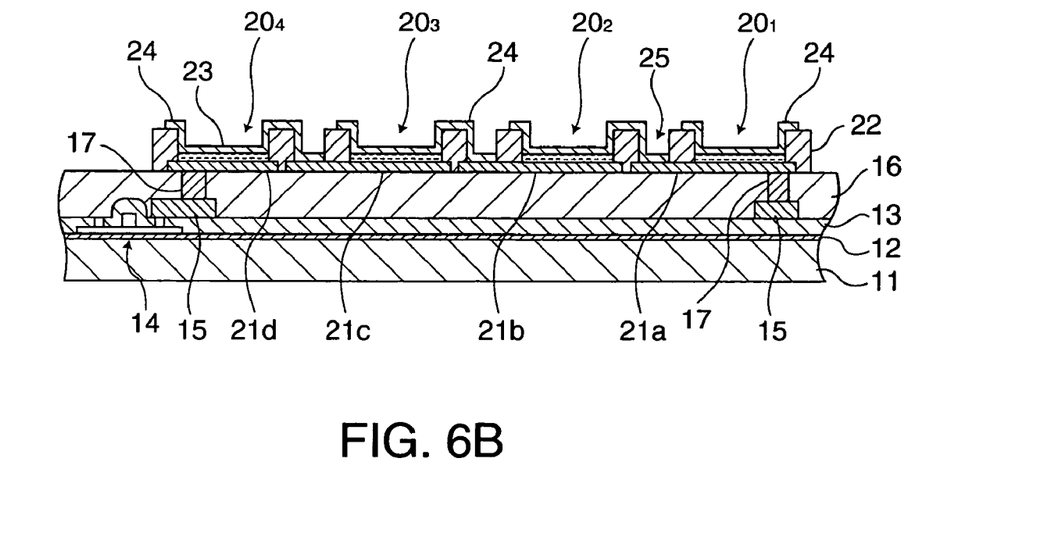
FIG. 6B is a sectional view of the organic EL display as the comparative example.
Figure 7:
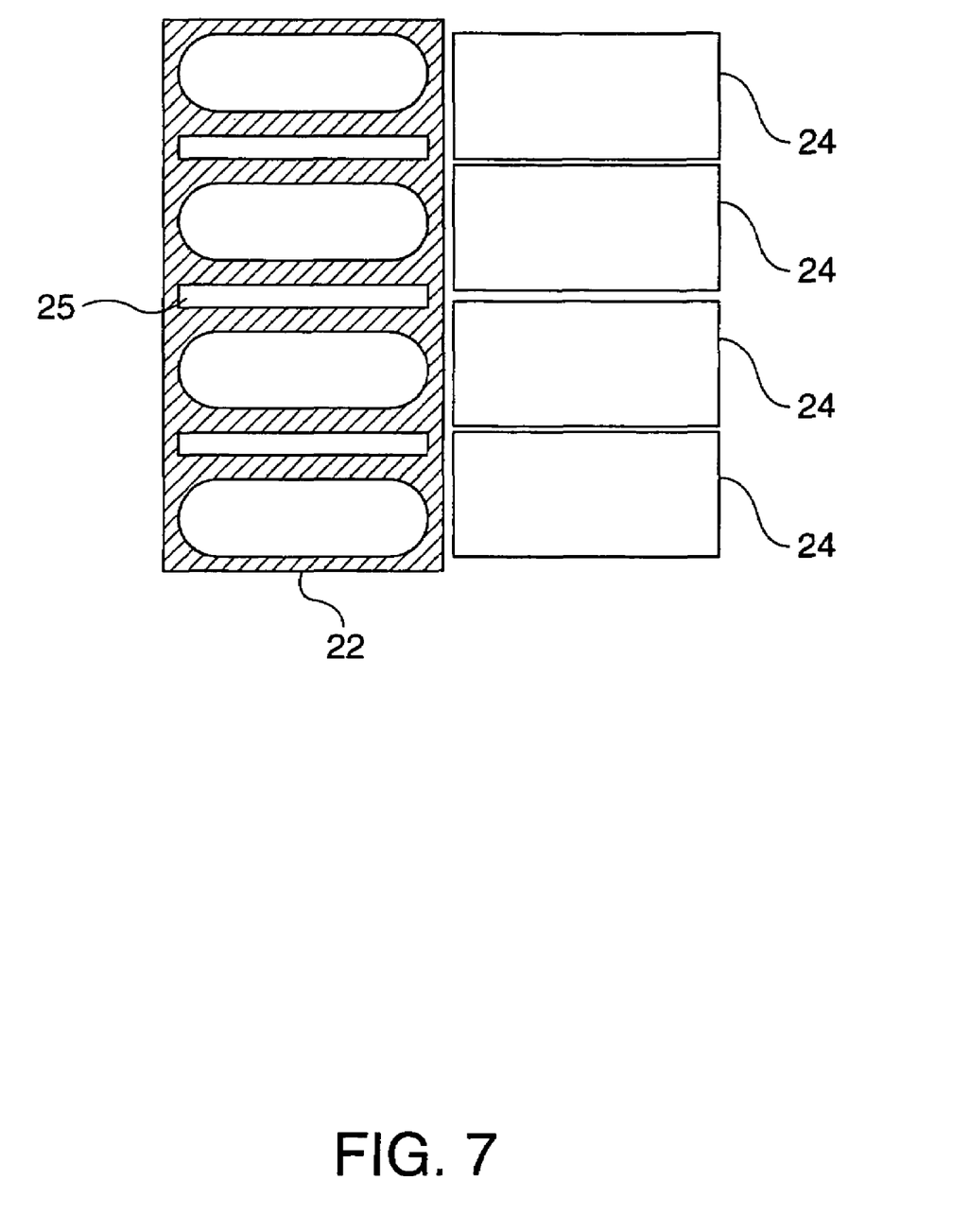
FIG. 7 is an explanatory diagram illustrating with a comparison the pattern of the bank layer 22 and the pattern of the second electrodes (upper electrodes) 24 of the comparative example.

FIGS. 6A, 6B and 7 illustrate a comparative example for facilitating the understanding of advantages of the above-described embodiment. Also in the comparative example, each color pixel is formed of plural (four) EL light-emitting elements that are connected in series. These elements however are typical organic EL light-emitting elements that emit light in response only to application thereto of either one of forward and reverse bias voltages (i.e., that have a diode characteristic). When using the one-directional elements, the elements need to be connected in series so that each element is forward biased.

FIG. 6A illustrates the pattern of the bank layer 22 of the comparative example. FIG. 6B is a sectional view illustrating an organic EL display of the comparative example. The same parts in FIG. 6 as those in FIG. 2 are given the same numerals, and description thereof will be omitted.

Referring to 6A, in the bank layer 22, three coupling regions 25 are provided among four EL light-emitting elements $20_1$ to $20_4$. As shown in FIG. 6B, the coupling regions 25 are used for coupling the first electrode 21 and the second electrode 24 of the neighboring EL light-emitting elements in order to connect the plural EL light-emitting elements 20 in series.

A comparison between FIGS. 2 and 6 makes it apparent that the embodiment does not need to include a structure for coupling the first and second electrodes, and therefore does not involve dead spaces due to the coupling regions 25.

FIG. 7 illustrates the patterns of the bank layer 22 and the second electrodes (upper electrodes) 24 of the comparative example. The same parts in FIG. 7 as those in FIG. 4 are given the same numerals.

A comparison between FIGS. 4 and 7 makes it apparent that the embodiment involves less segmentation of patterns of the bank layer 22 and the electrodes 24, which offers a margin of accuracy of pattern alignment and pattern shapes in the fabrication process.

Manufacturing of Organic EL Display

A method of manufacturing the organic EL display according to the embodiment will be described below with reference to step diagrams of FIGS. 8A to 8D. The same parts in FIG. 8 as those in FIG. 2 are given the same numerals.

Figure 8A:
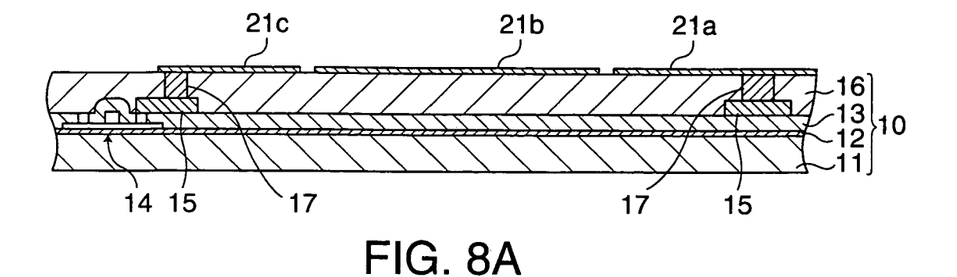
FIGS. 8A to 8D are step diagrams illustrating a manufacturing process for the organic EL display according to the embodiment.

Referring first to FIG. 8A, the semiconductor circuit board 10 is fabricated by using a publicly known process technique. The ITO 21 is deposited on the board 10 by sputtering or the like. The ITO 21 is patterned with using a mask corresponding to the pattern of the first electrodes (lower electrodes) of the EL light-emitting elements 20, to thereby form the first electrodes 21a, 21b and 21c.

Figure 8B:
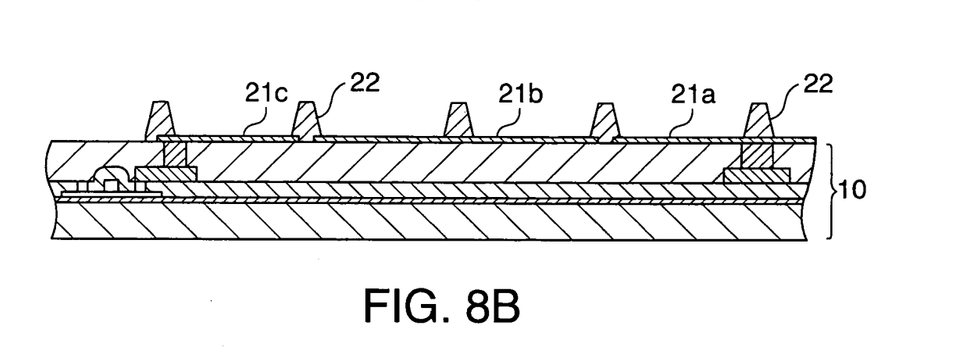

Referring next to FIG. 8B, photo resist is applied, and exposure therefor is carried out corresponding to the bank pattern, which is then followed by development therefor. Thus, the bank layer 22 separating EL light-emitting element regions is formed. The surface of the ITO layer 21 is provided with lyophilicity by implementing $O_2$ plasma treatment or the like. It is preferable that the bank layer 22 has lyophobicity. For example, addition of silicon to the resist, $CF_4$ plasma treatment, or the like allows the bank layer to have lyophobicity.

Figure 8C:
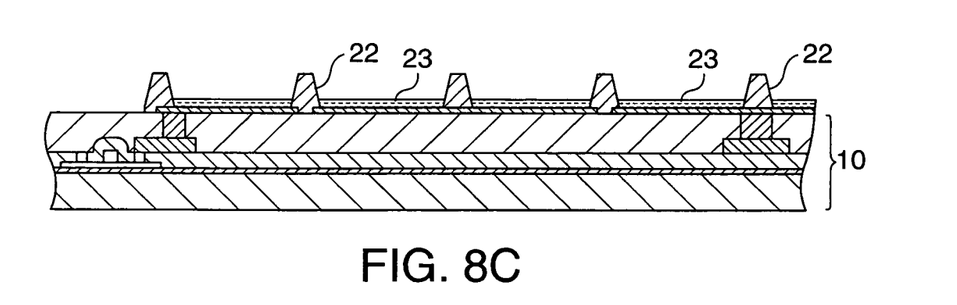

Referring next to FIG. 8C, the nonpolar luminescent layers 23 are formed on the first electrodes 21 (21a to 21c). As shown in FIG. 3, the buffer layer 23b is initially formed on the first electrode 21. For the buffer layer 23b, e.g. a material can be used that is prepared by dispersing 3,4-polyethylenedioxythiophene (PEDOT) into a polystyrene sulfonic acid (PSS) as a dispersion medium, and dissolving the dispersion liquid into a polar solvent such as water or isopropyl alcohol. This solution is applied on the first electrode 21 by a droplet discharge method (ink jet method), followed by being dried. Evaporating the dispersion medium and solvent completes the buffer layer (PEDOT) 23b. Use of the lyophobic bank layer 22 and the lyophilic electrode layer 21 leads to an advantage that the discharged solution is collected on the electrode layer 21 and uniformly spreads across the electrode face.

Subsequently, a luminescent layer forming material is applied on the buffer layer 23b by a droplet discharge method to thereby form the luminescent body 23a. As the luminescent layer forming material, a publicly known luminescent material capable of emitting fluorescence or phosphorescence is used. In addition, in the present embodiment, the different luminescent bodies are formed so that the emission wavelength bands thereof correspond to three primary colors of light, in order to allow full-color displaying. Specifically, one pixel is formed of three luminescent layers: a luminescent body R of which emission wavelength band corresponds to red, a luminescent body G corresponding to green, and a luminescent body B corresponding to blue. These luminescent bodies each emit gray-scale light, which allows the entire organic EL display 1 to perform full-color displaying.

As the forming material of the luminescent body 23a, specifically any of the following materials can preferably be used: a (poly) fluorene derivative (PF), a (poly) p-phenylenevinylene derivative (PPV), a polyphenylene derivative (PP), a poly-p-phenylene derivative (PPP), polyvinylcarbazole (PVK), a polythiophene derivative, and a polysilane material such as polymethylphenylsilane (PMPS). Furthermore, these high-molecular materials may be doped with a high-molecular material such as a perylene dye, coumarin dye or rhodamine dye, or a low-molecular material such as rubrene, perylene, 9,10-diphenylanthracene, tetraphenylbutadiene, nile red, coumarin 6 or, quinacridone.

As described above, the term high-molecular material refers to a polymer of which molecular weight is larger than that of a so-called low-molecular material, of which molecular weight is about several hundreds. The above-described high-molecular material encompasses, in addition to polymers sometimes called a macromolecule having a molecular weight of 10000 or larger, lower polymers called an oligomer having a molecular weight of 10000 or smaller.

In the present embodiment, MEHPPV (poly 3-methoxy 6-(3-ethylhexyl)p-phenylenevinylene) is used as the forming material of the red luminescent body R. A solution of a blend of polydioctylfluorene and F8BT (an alternating copolymer of dioctylfluorene and benzothiadiazole) is used as the forming material of the green luminescent body G. Polydioctylfluorene is used as the forming material of the blue luminescent body B. There is no particular limitation on the thickness of each luminescent layer 23. Although the preferable thickness is different for each color, it is preferable that, for example, the thickness of the blue luminescent body B is about 60–70 nm.

The buffer layer 23c is formed on the luminescent body 23a. The buffer layer 23c can be formed similarly to the buffer layer 23b. For the buffer layer 23c, e.g. a material can be used that is prepared by dispersing 3,4-polyethylenedioxythiophene (PEDOT) into a polystyrene sulfonic acid (PSS) as a dispersion medium, and dissolving the dispersion liquid into a polar solvent such as water or isopropyl alcohol. This solution is applied on the luminescent body 23a by a droplet discharge method (ink jet method), followed by being dried. Evaporating the dispersion medium and solvent completes the buffer layer (PEDOT) 23c. Use of the lyophobic bank layer 22 and the lyophilic electrode layer 21 leads to an advantage that the discharged solution is collected on the luminescent body 23a and uniformly spreads across the luminescent body face.

Figure 8D:
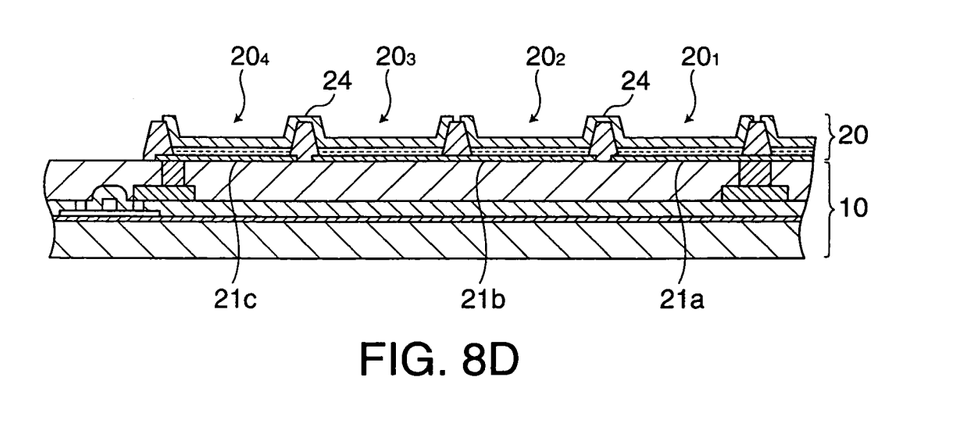

Referring next to FIG. 8D, the second electrode layers 24 are deposited by sputtering or the like on the luminescent layers 23 (the buffer layers 23c) and the bank layer 22, followed by being patterned with use of a mask corresponding to the pattern of the second electrodes (see FIG. 4). There are several methods as a method of patterning the second electrodes. For example, in one method, reverse-tapered resist called a cathode separator is formed in advance, which is then followed by deposition of the second electrode layers 24. In another method, after the second electrode layers 24 are deposited, the layers 24 are directly patterned by use of a laser. As the film material of the second electrode layer 24, gold, aluminum, nickel, palladium, or copper can be used for example.

In this manner, color pixels formed by connecting a plurality of EL elements in series are obtained, and an organic EL display in which each one pixel is formed of three color pixels is achieved.

Second Embodiment

Figure 9:
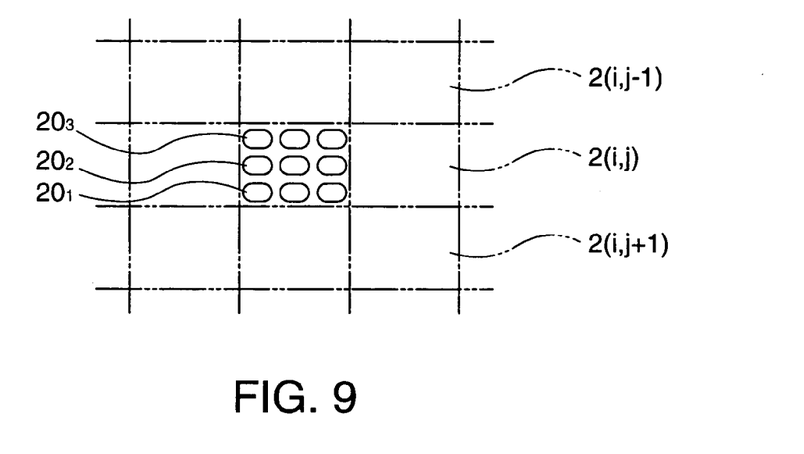
FIG. 9 is an explanatory diagram illustrating another embodiment employing an odd number of serially connected light-emitting elements.
Figure 10:
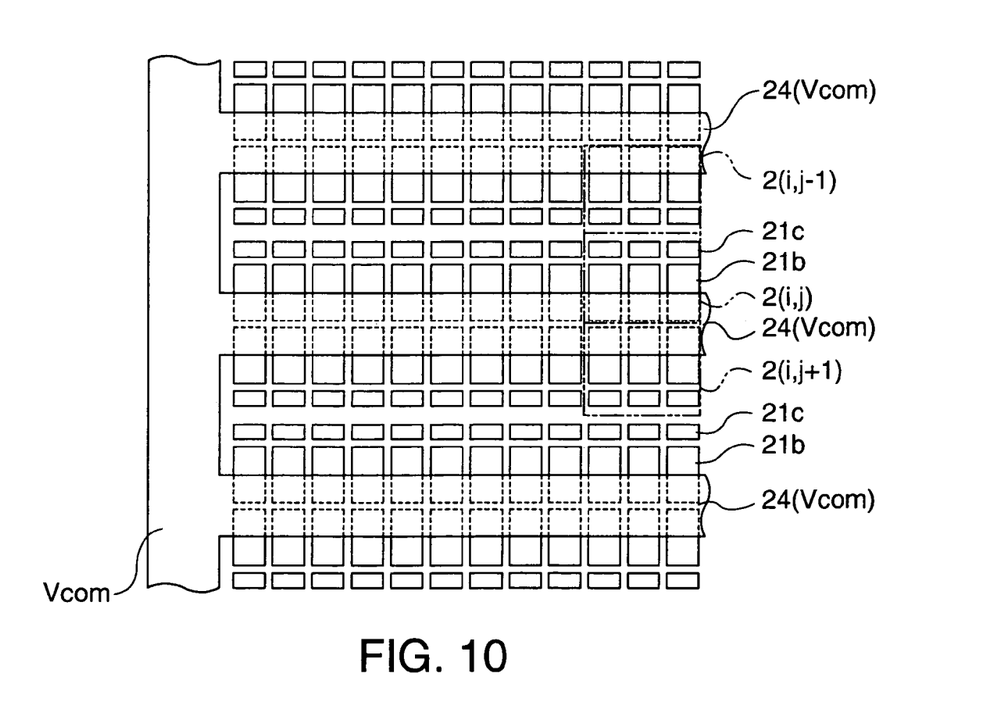
FIG. 10 is an explanatory diagram illustrating an example of an electrode arrangement pattern of the another embodiment.

FIGS. 9 and 10 illustrate another embodiment in which each color pixel is formed of three (odd number) EL light-emitting elements. The same parts in FIGS. 9 and 10 as those in FIGS. 1 and 5 are given the same numerals.

In this embodiment, the number of serially connected EL light-emitting elements is an odd number. In this case, the second electrode 24 is employed as a common electrode Vcom.

As described above, according to the embodiments of the invention, pixels are formed by connecting in series a plurality of nonpolar EL light-emitting elements. Therefore, the series connecting of the EL light-emitting elements is achieved by coupling the electrodes thereof at the same layer level, which avoids lowering of the aperture ratio of a display unit in the EL display.

The embodiments of the invention can be applied not only to organic (encompassing both high-molecular and low-molecular materials) EL light-emitting devices but also to inorganic EL light-emitting devices as long as nonpolar EL light-emitting elements are used.

Although a plurality of EL light-emitting elements are disposed on the semiconductor circuit board 10 with being connected in series along one direction in the above-described embodiments, a plurality of EL light-emitting elements may be disposed with being connected in series along two directions. Alternatively, a plurality of EL light-emitting elements may be disposed in a zigzag manner, and then may be connected in series.

Electronic Apparatus

FIGS. 11A to 11D illustrate examples of electronic apparatuses employing any of the above-described organic EL displays as its display unit for image information.

Figure 11A:
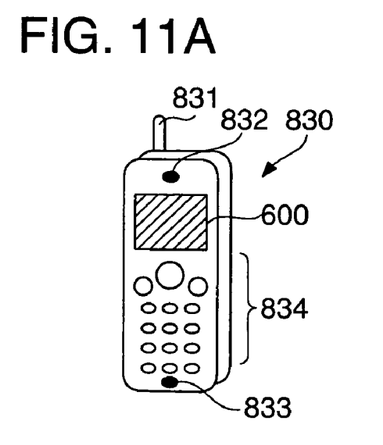
FIGS. 11A to 11D are explanatory diagrams illustrating examples of applications of the organic EL display according to any of the embodiments to electronic apparatuses.

FIG. 11A illustrates an application to a cellular phone. A cellular phone 830 includes an antenna 831, an audio output 832, an audio input 833, an operation unit 834, and an organic EL display 600 according to any of the above-described embodiments of the invention.

Figure 11B:
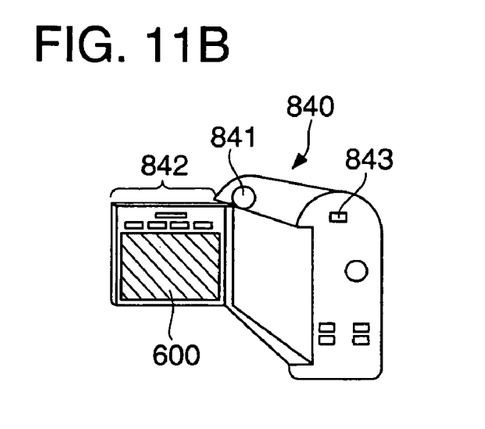

FIG. 11B illustrates an application to a video camera. A video camera 840 includes an image receiving unit 841, an operation unit 842, an audio input 843, and the organic EL display 600 according to any of the above-described embodiments.

Figure 11C:
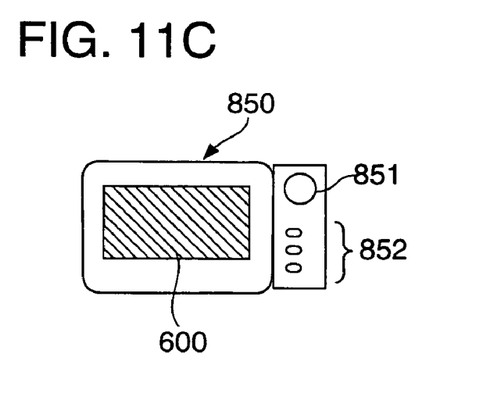

FIG. 11C illustrates an application to a portable personal computer. A computer 850 includes a camera unit 851, an operation unit 852, and the organic EL display 600 according to any of the above-described embodiments.

Figure 11D:
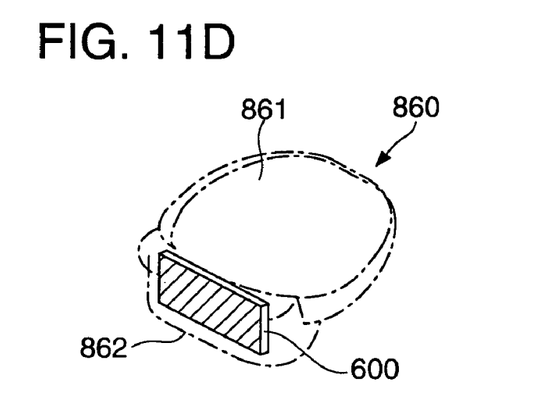

FIG. 11D illustrates an application to a head-mounted display. A head-mounted display 860 includes a band 861, an optical system housing 862, and the display 600 according to any of the above-described embodiments.

In this manner, an organic EL display according to any of the embodiments of the invention can be used as an image display unit of electronic apparatuses.

What is claimed is:

1. An electro-optical device comprising
a plurality of pixels arranged on a substrate, each of the pixels including a plurality of EL light-emitting elements that are disposed on the substrate and are connected in series, wherein:
each of the EL light-emitting elements includes a first electrode, a luminescent layer, and a second electrode that are disposed in a thickness direction of the substrate, and each of the EL light-emitting elements has a characteristic of emitting light in response both to a forward applied voltage and to a reverse applied voltage; and
the first electrodes or the second electrodes of neighboring EL light-emitting elements of the plurality of EL light-emitting elements are coupled to each other, so that the plurality of EL light-emitting elements are connected in series.

2. The electro-optical device according to claim 1, further comprising
a plurality of common electrode interconnects disposed along a row direction or a column direction of the plurality of arranged pixels, wherein
the common electrode interconnect serves as the first electrode or the second electrode of the EL light-emitting element closest to an end of the pixel, of the plurality of serially connected EL light-emitting elements included in the pixel.

3. The electro-optical device according to claim 1, wherein
the luminescent layer is formed of a multi-layered structure of a buffer layer, a luminescent body film, and a buffer layer.

4. The electro-optical device according to claim 3, wherein
the buffer layer includes polyethylenedioxythiophene (PEDOT).

5. An electronic apparatus comprising as a display unit the electro-optical device according to claim 1.

* * * * *